United States Patent [19]

Kallfass

[11] Patent Number: 5,154,772
[45] Date of Patent: Oct. 13, 1992

[54] APPARATUS FOR TREATING PLATE-SHAPED ARTICLES

[75] Inventor: Karl-Heinz Kallfass, Baiersbronn, Fed. Rep. of Germany

[73] Assignee: Gebr. Schmid GmbH & Co., Fed. Rep. of Germany

[21] Appl. No.: 545,390

[22] Filed: Jun. 27, 1990

[30] Foreign Application Priority Data

Jul. 5, 1989 [DE] Fed. Rep. of Germany ....... 3922056

[51] Int. Cl.⁵ .......................... B05C 3/02; B05C 3/10; B65G 49/02
[52] U.S. Cl. ..................................... 118/404; 118/411; 118/413; 118/423; 118/428; 277/12; 277/DIG. 7
[58] Field of Search ............... 118/405, 404, 419, 411, 118/412, 413, 414, 423, 424, 427, 428; 277/DIG. 192, 12, DIG. 7; 264/154, 339, 155, 156; 206/453, 523, 592

[56] References Cited

U.S. PATENT DOCUMENTS

| | | | |
|---|---|---|---|
| 2,457,128 | 12/1948 | Churnell | 118/405 |
| 2,540,006 | 1/1951 | Otto | 118/405 |
| 2,647,297 | 8/1953 | Shive | 118/405 |
| 2,851,373 | 9/1958 | Tregay et al. | 118/404 |
| 3,350,248 | 10/1967 | Demarest et al. | 118/405 |
| 3,402,696 | 9/1968 | Richards | 118/405 |
| 3,554,641 | 11/1971 | Jefee et al. | 118/404 |
| 4,245,584 | 1/1981 | Kolosov et al. | 118/405 |
| 4,539,931 | 9/1985 | Kikuta et al. | 118/404 |

FOREIGN PATENT DOCUMENTS

| | | |
|---|---|---|
| 2343524 | 3/1974 | Fed. Rep. of Germany . |
| 2420824 | 5/1975 | Fed. Rep. of Germany . |
| 3001726 | 8/1981 | Fed. Rep. of Germany . |
| 3022146 | 12/1981 | Fed. Rep. of Germany . |

Primary Examiner—Willard Hoag
Attorney, Agent, or Firm—Barry R. Lipsitz

[57] ABSTRACT

In an apparatus for treating plate-shaped articles in a liquid medium including a bath containing the liquid medium with gap-like inlet and outlet openings arranged beneath the liquid level and a conveying device for conveying the plate-shaped articles along a substantially flat path of conveyance through the inlet and outlet openings and through the liquid medium in the bath, in order to reduce the loss of liquid from the bath, it is proposed that the inlet and outlet openings comprise sealing elements which are movable from a closed to an open position as the plate-shaped articles pass through them and which are furthermore of such design that the gap created by the sealing elements in their open position is substantially adaptable in height and width to the cross-section of the articles passing through it.

8 Claims, 2 Drawing Sheets

APPARATUS FOR TREATING PLATE-SHAPED ARTICLES

The invention relates to an apparatus for treating plate-shaped articles in a liquid medium. The apparatus comprises a bath containing the liquid medium with gap-like inlet and/or outlet openings arranged beneath the liquid level and a conveying device for conveying the plate-shaped articles along a substantially flat path of conveyance through the inlet and/or outlet openings and through the liquid medium in the bath.

Such apparatus are, for example, known as etching machines for treating printed circuit boards or also as hot tinning installations wherein printed circuit boards are similarly conveyed as plate-shaped articles through a liquid medium, in this case, solder, to obtain a layer of solder on the conductors and/or at the through connections.

To achieve uniform treatment of the top and bottom surfaces of the plate-shaped articles, in particular of the printed circuit boards, it is necessary for the plate-shaped articles, hereinafter referred to as printed circuit boards, to be guided underneath the liquid level of the liquid medium in the treatment bath.

Owing to the sensitivity of the printed circuit boards to mechanical stress, the printed circuit boards should be conveyed along one plane and, therefore, at least the inlet or outlet opening of the bath has to be arranged beneath the liquid level of the liquid medium in the bath container.

In the apparatus known to date for treating printed circuit boards in a liquid medium, the inlet and outlet openings are formed by pairs of rolls which are rotatably arranged transversely to the direction of conveyance and only open a gap between them which corresponds to the thickness of the printed circuit board.

Since the apparatus for treating the printed circuit boards with a liquid medium should be universally employable for all printed circuit board sizes, the width of the rolls and hence also the width of the gap at the inlet or outlet opening had to be of such dimensions that the largest printed circuit board to be treated could be conveyed into and out of the bath in an unobstructed manner.

With different widths of the printed circuit boards to be treated, the gap then remained open to a greater or lesser extent at the sides of a board passing through it, with the result that the liquid medium of the bath escaped from the bath container to a greater or lesser extent and had to be fed back to the actual bath via suitable conveying devices. In the printed circuit boards commonly used today, in particular in the multilayer boards, the board thicknesses are up to 10 mm and with relatively small board widths these then result in a major loss of liquid medium from the actual bath container which can only be compensated by appropriately dimensioned recirculating devices for the liquid medium.

Since small-scale production is becoming increasingly important in the manufacture of printed circuit boards, i.e., also flexibility in the production of different printed circuit boards in short time units, the object underlying the invention, based on the problems explained hereinabove, is to propose an apparatus for treating plate-shaped articles in a liquid medium wherein the loss of liquid from the bath is significantly reduced.

This object is accomplished in accordance with the invention in an apparatus of the kind described at the beginning by the inlet and/or outlet openings comprising sealing elements which are movable from a closed to an open position as the plate-shaped articles pass through them and which are furthermore of such design that the gap created by the sealing elements in their open position is substantially adaptable in height and width to the cross-section of the articles passing through it.

Embodiments are structurally particularly simple wherein the front edge, viewed in the direction of conveyance, of the plate-shaped articles, in particular of the printed circuit boards, moves the sealing elements into the open position by mechanical contact with them. This could, for example, be implemented by mechanical sensing of the board width and synchronous adjustment of the gap width. It has, however, proven particularly expedient for the sealing elements to comprise a plurality of sealing segments arranged parallel to one another and pivotable about a common axis transversely to the direction of conveyance. In their closed position, these sealing segments protrude into the path along which the printed circuit boards are conveyed and during conveyance of the printed circuit boards are thus raised by the edge of the board and pivoted into the open position. The resulting gap is simultaneously covered by the front edge of the printed circuit board so only an insignificant amount of liquid medium escapes from the bath.

As abutment for the sealing elements and as component of the inlet and outlet openings, it is recommended that a roll which, if appropriate, may be drivable, be arranged transversely to the direction of conveyance below the plane of conveyance to support and, if appropriate, actively transport the printed circuit boards at the inlet and outlet openings.

In their closed position, the pivotable sealing segments lie sealingly against the roll.

To achieve minimal friction between the sealing segments and hence easier pivotability of the segments, provision may be made for the sealing segments to be spaced laterally at a slight distance from one another. It should then be ensured that the surface tension of the liquid media used in the bath is so high in comparison with the material used for the sealing segments that substantially no liquid can escape from the bath through the gap.

In one of the preferred embodiments, the sealing segments are pretensioned in their pivoting motion in the direction towards the closed position by, for example, spring elements.

Additionally or alternatively to this, the pivot axis of the sealing segments may be spaced from the center of gravity of the segments so that merely on account of this arrangement, the sealing segments automatically move in the direction towards the closed position when the specific density of the segment material is greater than that of the liquid contained in the bath.

The closing effect of the sealing segments may, of course, be reinforced by mounting weights at a distance from the pivot axis. Alternatively to this, it is, for example, conceivable, in the case of the sealing segments arranged at the outlet opening, to provide a hollow chamber which causes buoyancy in the medium at one end of the segments and hence likewise brings about an increase in the returning force of the sealing segments in the direction towards the closed position.

BRIEF DESCRIPTION OF THE DRAWINGS

These and further advantages of the invention are explained in further detail hereinbelow with reference to the appended drawings which show:

FIG. 1 shows an apparatus designated in its entirety 10 for treating plate-shaped articles in a liquid medium or a so-called bath station where plate-shaped articles 12, hereinafter referred to as printed circuit boards, are conveyed via a conveying device 14 into a bath container 16. The plane of conveyance which is defined by the conveying device 14 for the printed circuit boards 12 is designated 18 (dot-and-dash line in FIG. 1 and area illustrated in FIG. 2).

The conveying device 14 is comprised of a plurality of pairs of rolls 20, 21, some of which are driven and others of which run as friction rolls along with the printed circuit boards being conveyed.

Figure 1:
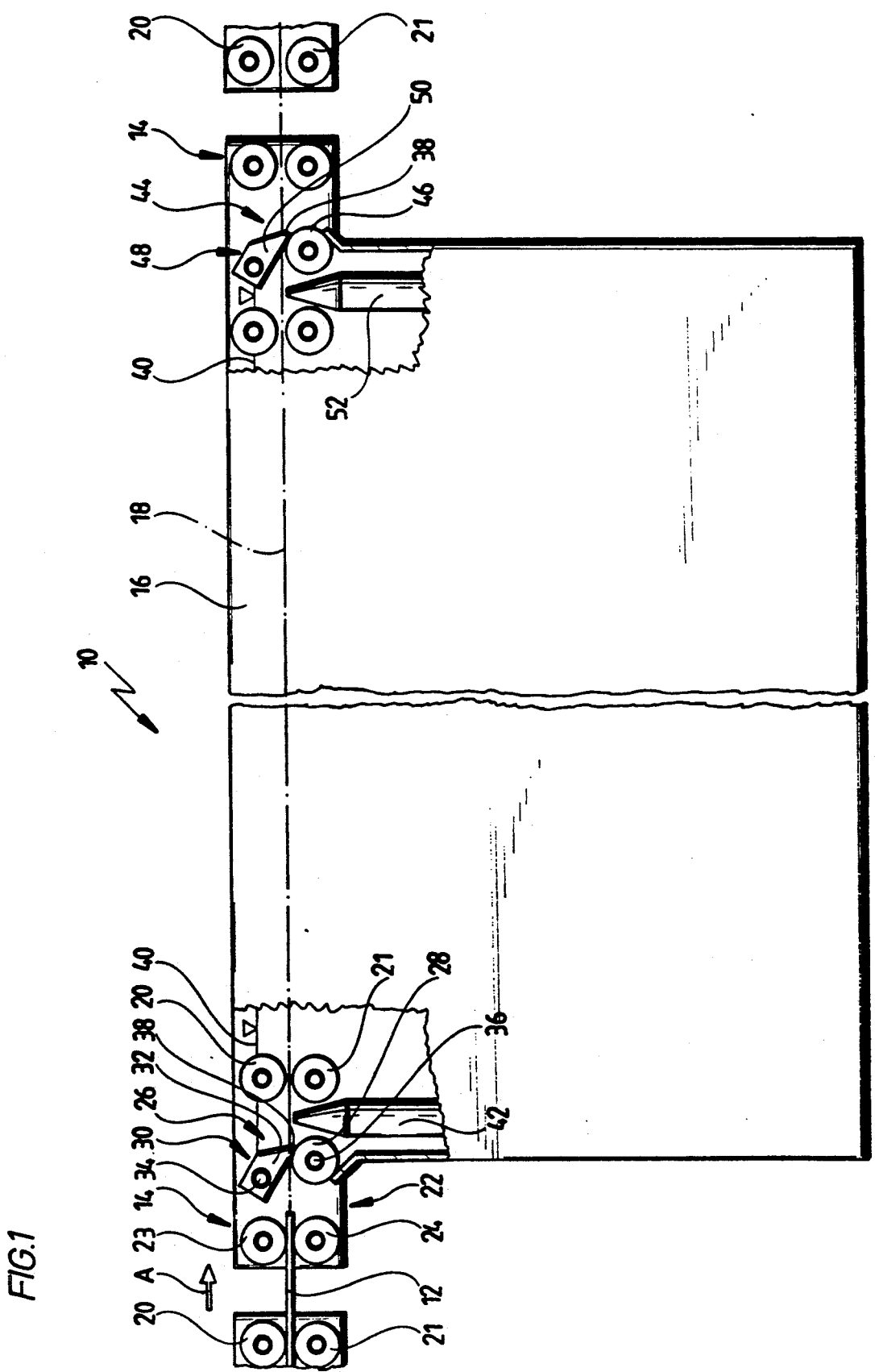
FIG. 1 a schematic side view of an apparatus according to the invention.
Figure 2:
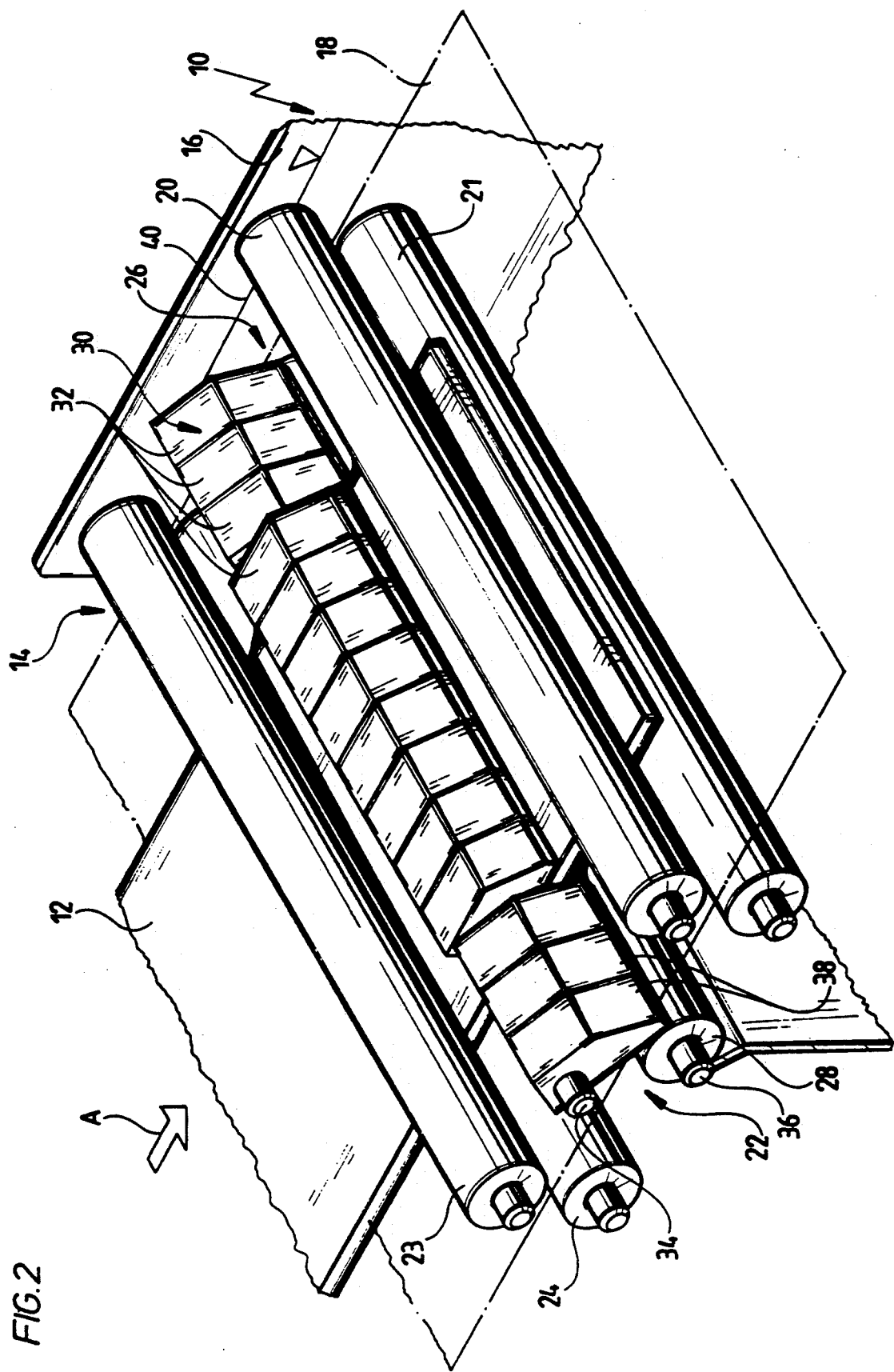
FIG. 2 a perspective detail view of an inlet opening of an apparatus according to the invention.

An inlet region 22 of the bath station, illustrated additionally in detail in FIG. 2, comprises guide rolls 23, 24 which are arranged one above the other and impart defined guidance to the printed circuit boards 12 entering the bath station in the direction towards an inlet opening 26.

The inlet opening 26 comprises a roll 28 which is arranged transversely to the direction of conveyance and underneath the plane of conveyance 18. The roll 28 serves as abutment for a sealing element 30. The sealing element 30 comprises a plurality of sealing segments 32 which are pivotable about an axis 34 in a plane perpendicular to the plane of conveyance 18. The axis 34 is arranged parallel to the axis of rotation 36 of the roll 28.

Owing to the fact that the sealing segments 32 are held for rotation about the axis 34 outside of their center of gravity, the sealing ends 38 of the segments 32 automatically move in the direction towards the roll 28 located thereunder and thus seal off the inlet opening 26.

The liquid level in the bath container 16, designated 40, lies above the plane of conveyance 18 and can be raised from the latter up to approximately a distance therefrom which corresponds to the diameter of the conveying rolls 20 or guide rolls 23.

Feed nozzles 42 may be arranged directly adjacent to the inlet region to rinse the incoming printed circuit boards 12 with fresh medium.

The basic shape of the sealing segments 32 can be adapted to the existing spatial conditions and is shown in the illustrated embodiments as bevelled right parallelepiped. The advantage of the bevelling is that during the pivotal motion of the sealing segments 32 above the plane of conveyance, not too much space is required to enable the segments to move into the open position.

The sealing segments may be provided with additional weights at their ends 38 resting on the roll 28 so the segments themselves can be made from a relatively light material and yet a good sealing effect is achieved even with a medium having a larger specific weight. However, a material for the segments 32 is preferred which inherently has a density which is greater than the density of the medium by the factor of 1.5 to 2.

An outlet opening 44, designed and constructed, in principle, in analogy with the inlet opening 26, is arranged on the outlet side of the bath station 16. A roll 46 forms the abutment for a sealing element 48 comprised of sealing segments 50 which rest with their pivotable end sealingly on the roll 46. The roll 46 borders with its circumferential surface beneath the plane of conveyance 18 on the wall of the bath container 16 and together with the sealing element 48 closes off the top of the bath container 16 in the region of the outlet opening 44. Arrangement and layout of the inlet opening 26 such that the roll 28 is in sealing contact with the wall of the bath container 16 ensures at the end of the inlet opening 26 that a liquid level 40 is maintained there above the plane of conveyance 18.

A further nozzle 52 is arranged at a short distance before the outlet opening 44 in the bath container 16. This nozzle 52 enables defined circulation of the liquid medium in the bath container 16 in the outlet region of the bath container so the printed circuit boards 12 are rinsed on leaving the treatment apparatus.

As seen best in FIG. 2, the sealing segments 32 (and 50, respectively) are moved by a printed circuit board 12 moving in the direction of conveyance (arrow A) from their position of rest which simultaneously represents the closed position of the inlet and outlet openings into an open position. The pivoting of the sealing segments 32, 50 is brought about mechanically by the printed circuit board 12 entering the inlet and outlet openings 26, 44, respectively, with its front edge, whereby only a gap corresponding to the width of the printed circuit board is opened. The remaining segments 32, 50 remain in their position of rest and thus prevent an excessive amount of liquid from escaping from the bath container 16. A satisfactory sealing effect is, for example, achieved with segment widths (seen in the direction transverse to the direction of conveyance) of approximately 1 cm. With the inventive apparatus, in addition to an optimum gap width, optimum gap height is simultaneously regulated as only a gap with a height corresponding to the cross-section of the printed circuit board 12 is opened while the printed circuit boards 12 enter and leave the bath container 16.

The insignificant amounts of liquid escaping from the bath container 16 are collected in a collecting vessel (not illustrated) and fed back to the bath container 16 via a circulating device. This does not involve any greater expenditure as circulation of the liquid in the bath container 16 is necessary in any case.

It is, of course, conceivable for the plane of conveyance 18 to be slightly inclined in relation to the horizontal, whereby either only the inlet opening 26 or the outlet opening 44 is made to lie below the liquid level 40. In these cases, sealing in the inventive manner is then only necessary in the region of the inlet opening 26 or the outlet opening 44, respectively. Apparatus wherein the plane of conveyance extends substantially horizontally are, however, preferred as these can then be easily incorporated into such other production processes and treatment apparatus as are required for the manufacture of printed circuit boards.

The liquid medium in the bath container 16 may, for example, be an etching solution with which excessive amounts of copper are removed from the surface of the printed circuit boards by etching. It may, however, contain quite different media such as, for example, fluxing agent or liquid solder, as used, for example, in a hot tinning installation.

The material from which the segments 32, 50 are made depends, on the one hand, on the operating temperature of the bath station 10 and, on the other hand, of course, on the specific density of the liquid medium used. In the case of a hot tinning installation where the liquid medium has a relatively high density, it may be recommendable for the sealing segments 32, 50 to be pretensioned in the direction of the closed position.

In connection with the design of the sealing segments 32, 50, it is also important for these to exhibit as little surface roughness as possible on the surface which comes into contact with the printed circuit boards in order to prevent, as far as possible, damage to the surface of the printed circuit boards 12 sliding through the inlet and outlet openings.

In many cases in which liquid media are used, an appropriately selected plastics material may be utilized as material for the sealing segments 32, 50. Here a specific density of between 1.5 and 2.0 is often observed and so their own weight is sufficient for automatically pivoting the segments into the position of rest and hence for the sealing effect.

The present disclosure relates to the subject matter disclosed in German application No. P 39 22 056.7 of Jul. 5, 1989, the entire specification of which is incorporated herein by reference.

What is claimed is:

1. Apparatus for treating plate-shaped articles in a liquid medium, said apparatus comprising a bath containing said liquid medium with at least one of a gap-like inlet and outlet opening arranged beneath the liquid level, and said apparatus further comprising a conveying device for conveying said plate-shaped articles along a substantially flat path of conveyance through said opening and through said liquid medium in said bath, wherein said opening comprises sealing elements which are movable from a closed to an open position as said plate-shaped articles pass through said opening and which are furthermore of such design that the gap created by said sealing elements in their open position is substantially adaptable in height and width to the cross-section of said articles passing through it, said sealing elements comprising a plurality of sealing segments arranged parallel to one another and pivotable about a common axis.

2. Apparatus as defined in claim 1, wherein said pivotable sealing segments are spaced laterally at a slight distance from one another.

3. Apparatus as defined in claim 1, wherein said sealing elements are pretensioned in the direction towards the closed portion.

4. Apparatus as defined in claim 1, wherein said pivot axis of said sealing segments is spaced from the center of gravity of said segments.

5. Apparatus as defined in claim 1 wherein both a gap-like inlet opening and a gap-like outlet opening are provided.

6. Apparatus for treating plate-shaped articles in a liquid medium, said apparatus comprising a bath containing said liquid medium with at least one of a gap-like inlet and outlet opening arranged beneath the liquid level, and said apparatus further comprising a conveying device for conveying said plate-shaped articles along a substantially flat path of conveyance through said opening and through said liquid medium in said bath, wherein said opening comprises a plurality of separate sealing elements which are arranged parallel to each other and are independently movable from a closed to an open position as said plate-shaped articles pass through the opening and which are furthermore of such design that the gap created by said sealing elements in their open position is substantially adaptable in height and width to the cross-section of said articles passing through it, said opening comprising a roller as an abutment for said sealing elements.

7. Apparatus as defined in claim 6, wherein said movable sealing elements rest in their closed position sealingly against said roller.

8. Apparatus as defined in claim 6 including means for driving said roller.

* * * * *